United States Patent [19]
Muroya

[11] Patent Number: 6,111,906
[45] Date of Patent: Aug. 29, 2000

[54] DISTRIBUTED-FEEDBACK SEMICONDUCTOR LASER

[75] Inventor: Yoshiharu Muroya, Tokyo, Japan

[73] Assignee: NEC Corporation, Tokyo, Japan

[21] Appl. No.: 09/039,561

[22] Filed: Mar. 16, 1998

[30] Foreign Application Priority Data

Mar. 17, 1997 [JP] Japan ................................ 9-063083

[51] Int. Cl.⁷ .................................................. H01S 3/08
[52] U.S. Cl. ............................. 372/96; 372/44; 372/102
[58] Field of Search ............................... 372/50, 96, 102

[56] References Cited

U.S. PATENT DOCUMENTS

| 5,031,993 | 7/1991 | Asthana | 350/96.19 |
| 5,033,053 | 7/1991 | Shimizu | 372/50 |
| 5,930,278 | 7/1999 | Menigaux | 372/50 |
| 5,981,307 | 11/1999 | Matsuda | 438/32 |

FOREIGN PATENT DOCUMENTS

| 404073985 | 3/1992 | Japan . |
| 4-100287 | 4/1992 | Japan . |
| 7-131104 | 5/1995 | Japan . |

OTHER PUBLICATIONS

Proceedings of the 1996 Electronics, Information & Telecommunication Society Electronics Society Conference C–314, Sep. 18–21, 1996, "Precise Corrugation Pitch Control of DFB–LDs by Weighted–dose Allocation Variable–pitch EB–lithography", Kanazawa Univ., Kanazawa, Japan, p. 314.

M. Okai et al., "Corrugation–Pitch Modulated MQW–DFB Lasers with Narrow Spectral Linewidth", *IEEE Journal of Quantum Electronics*, vol. 27, No. Jun. 6, 1991.

Patent Abstract of U.S. 5,340,637, Okai et al., Aug. 1994.

Patent Abstract of U.S. 4, 704, 720, Yamaguchi, Nov. 1987.

Patent Abstract of U.S. 4,665,528, Chinone, May 1987.

*Primary Examiner*—Frank G. Font
*Assistant Examiner*—Gioacchino Inzirillo
*Attorney, Agent, or Firm*—Foley & Lardner

[57] ABSTRACT

A stable single-mode oscillation semiconductor laser is obtained by flattening the distribution of electric field intensity in the direction of the resonator axis, and to provide a distributed-feedback semiconductor laser generator having a more satisfactory difference in threshold gain between the principal and subsidiary modes. The laser includes an active layer which radiates light as a result of the injection of electrons, a light guide layer which is next to this active layer guides light emitted from the active layer, a plurality of semiconductor layers between which the active layer and light guide layer are interposed, electrodes which permit electrons to be injected from these semiconductor layers into the active layer, a non-reflective coating provided on both ends of the active layer in the direction of oscillation, and a diffraction grating which is provided on the light guide layer for selecting the oscillatory wavelength of the light. The diffraction grating has a plurality of uniform pitch areas formed with a uniform and equal pitch, and a varying pitch area interposed between the uniform pitch areas and having a plurality of pitches longer and shorter than those of these uniform pitch areas, the latter serving to select the oscillatory wavelength of the light, where the absolute value of the sum-total of the amount of phase change in the varying pitch area (cumulative amount of phase change) in relation to the phase in the uniform pitch areas is between 3/2 and 11/2 times the pitch of the diffraction grating of the uniform pitch areas.

14 Claims, 6 Drawing Sheets

F I G. 1
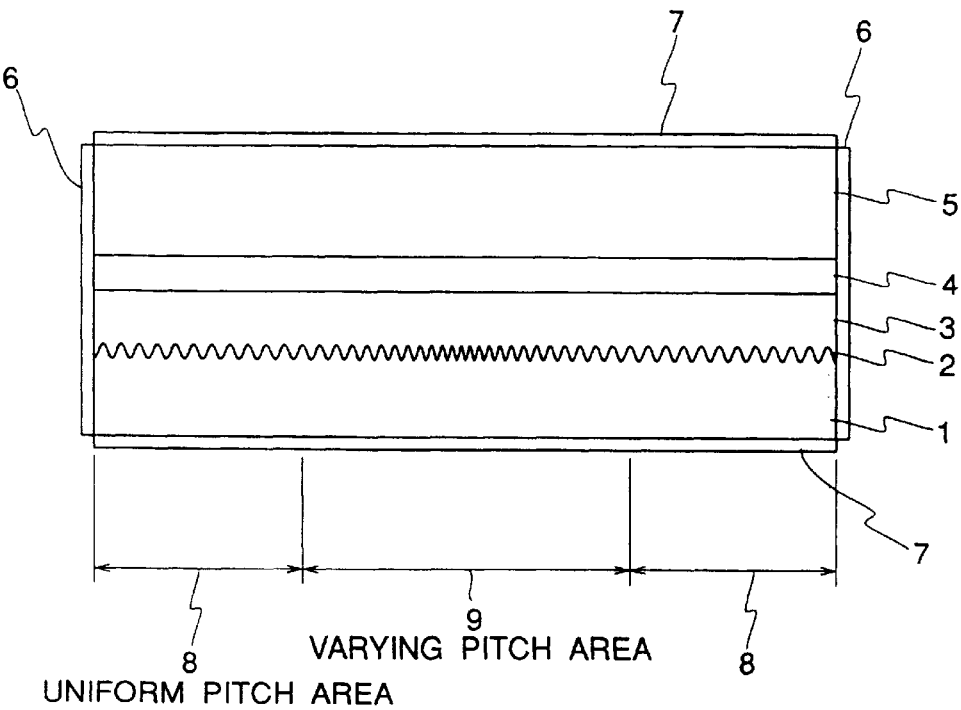
F I G. 2
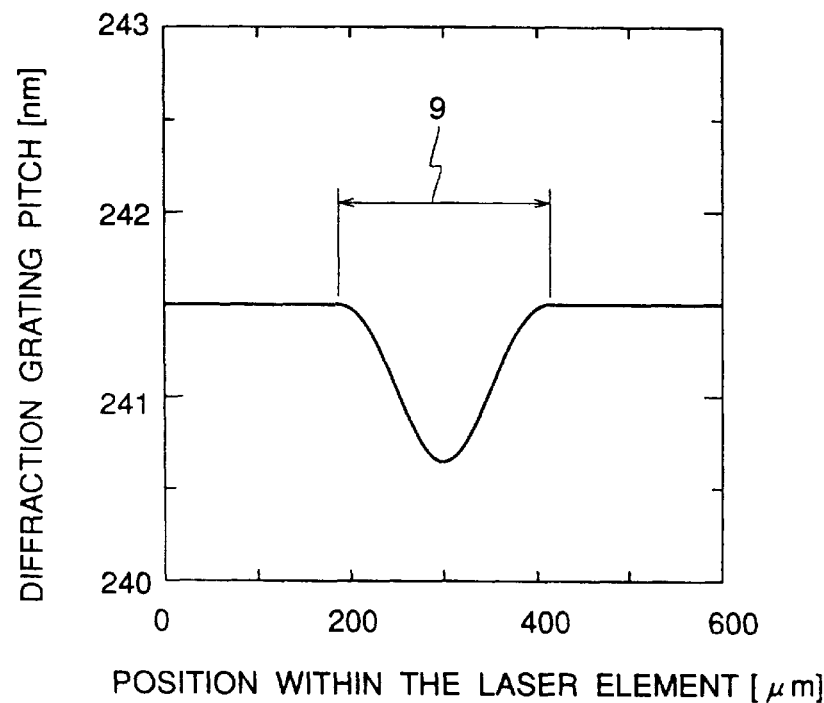

F I G. 3
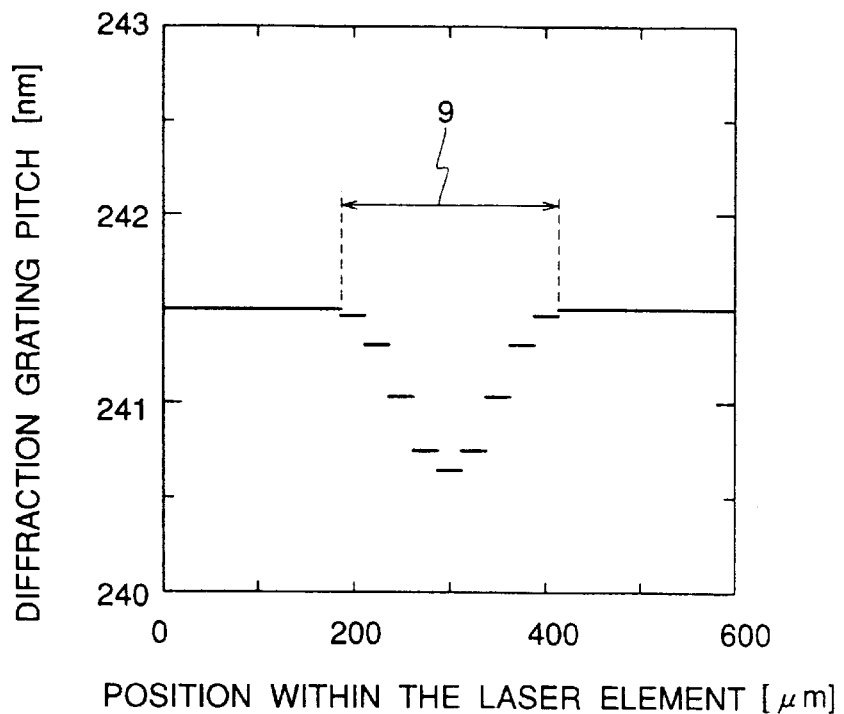
F I G. 4
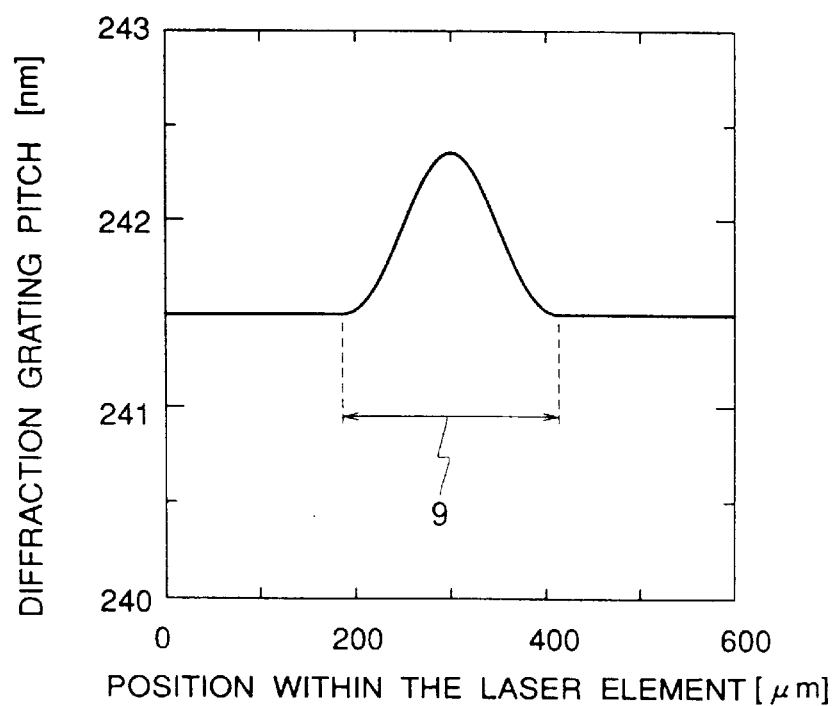

F I G. 9
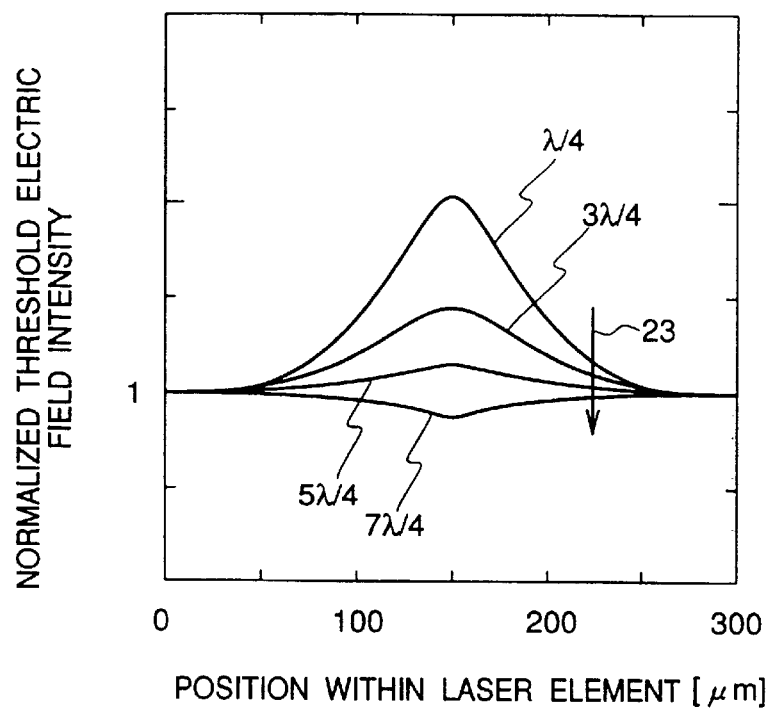

DISTRIBUTED-FEEDBACK SEMICONDUCTOR LASER

BACKGROUND TO THE INVENTION

The present invention relates to a semiconductor laser, and in particular to a distributed-feedback semiconductor laser.

Semiconductor lasers have valence bands where electrons break away from atoms and create holes, and conduction bands where electrons move around freely. Valence bands form continuums of a low energy level, while conductors have a high energy level. When a positive valence band hole and a negative conductor electron re-bond, light is emitted, and a laser beam is generated. In other words, the movement of an electron from a high energy level to a low energy level causes light to be emitted in an active layer several microns thick in the junction area of the conductor and the valence band. Double heterojunctions have been developed, allowing different types of conductor to participate in double bonds so as to generate laser beams continuously at room temperature. Moreover, techniques have been developed whereby the cleavage planes of semiconductor laser devices are protected by a thin film, and long-life semiconductor lasers have been put to practical use.

The coherent nature of laser beams renders them eminently suited to use in fields as diverse as those of spectroscopy, instrumentation, optical communications, printing, optical discs and chemistry. In optical communications systems in particular, numerous improvements have been made in order to relay large amounts of data at high speeds over long distances. It is desirable that laser devices used as light-emitting elements in optical communications should transmit stably on a single wavelength. For instance, in the case of long-distance high-speed optical communications employing InGaAsP lasers with a wavelength of 1.55 micrometers, even relaxation oscillations require to be generated on a single wavelength because of the considerable material dispersion of the optical fibres.

Distributed-feedback lasers are an apparatus of securing single-wavelength oscillations. Within faces which are perpendicular to the optical axis of the laser beam, standing waves are created in perpendicular and parallel directions to the active layer. The perpendicular transverse mode comes about as a result of the light-entrapping effect of a double heterojunction, while the parallel transverse mode results from various stripe configurations.

Standing waves which are created between reflective surfaces are known as longitudinal mode. When the longitudinal mode changes, so does the oscillation wavelength, and it proves impossible to achieve single-wavelength oscillation. Distributed-feedback semiconductor laser devices, on the other hand, are provided with diffraction gratings which are characterised by cyclic changes in refractivity along the active layer. The presence of these diffraction gratings means that part of the optical waves which leak from the active layer are reflected cyclically. Generally speaking, diffraction gratings are fashioned in the form of irregularities at a prescribed pitch in the guide layer or clad layer which adjoins the active layer above or below. Thus, optical waves proceeding parallel with the diffraction gratings are partially reflected at a prescribed angle perpendicular to the direction of reflection. This is how single-mode oscillation has been achieved.

One example of this type of semiconductor laser is the $\lambda/4$ phase shift distributed-feedback semiconductor laser (hereinafter referred to as '$\lambda/4$ phase shift laser'). This $\lambda/4$ phase shift laser achieves single-mode (single-wavelength) oscillation by virtue of Bragg wavelengths induced by diffraction gratings. In $\lambda/4$ phase shift lasers of this sort, there is a tendency for the electric field to converge on the phase-shifting diffraction grating if the normalized coupling coefficient (k) is great. This is inconvenient because it leads to instability of single-mode oscillation at times of high output.

Techniques for flattening the distribution of electric field intensity in the axial direction of the resonator in this phase shift laser so as to ensure stability of oscillation in single mode have been suggested, for example, in Japanese Patent Publication No. A-4-100287, or by Okai et al. in *IEEE J. Quantum Electronics* Vol. 27, pp. 1767–72 (1991).

The proposed semiconductor laser is of the configuration illustrated in FIG. 10, where two types of diffraction gratings with differing pitchs are formed within the resonator (laser element) as shown in FIG. 11. This type of distributed-feedback semiconductor laser will be referred to hereinafter as a cyclic modulation laser.

In FIG. 10, a diffraction grating 12 is formed on a semiconductor substrate 11 for the purpose of selecting the oscillation wavelength. On the semiconductor substrate 11 on which is formed the diffraction grating 12 are also formed by MOPVE (metal-organic vapour phase epitaxy) growth an optical guide layer 13, an MQW (multi-quantum well) active layer 14 with gain, and a clad layer 15 in that order. Sandwiching this MQW active layer 14 between the n-type semiconductor substrate 11, which has a large band gap, and the p-type semiconductor clad layer 15 allows the formation of a double heterostructure (DH).

Referring to FIG. 11, the diffraction grating is such that the areas at both ends of the laser element are formed with equal and uniform pitch or cycle (uniform pitch areas 18), while the central area has a shorter pitch or cycle (phase adjustment area 19).

On the surface of the semiconductor substrate 11 and the clad layer 15 are each located electrodes 17, the purpose of which is to inject electrons from the semiconductor substrate 11 into the MQW active layer 14, while to both ends of the laser element is applied an AR coating (non-reflective coating) 16.

Here, the sum-total of the amount of phase change induced by the diffraction grating of the phase adjustment area 19 in relation to the phase of the diffraction grating of the uniform pitch areas 18 is defined as the amount of cumulative phase change.

In the cyclic modulation laser illustrated in FIG. 10, the diffraction grating of the phase adjustment area 19 is constructed in such a manner that the amount of cumulative phase change is one half of the pitch of the diffraction grating of the uniform pitch areas 18. That is to say, in the example illustrated in FIG. 10, the diffraction grating of the phase adjustment area 19 is constructed so as to be one quarter of the wavelength ($\lambda/4$) in relation to the standing wave of the laser beam within the resonator.

Conventional distributed-feedback semiconductor lasers, having had within the laser element diffraction gratings with two differing types of pitch, have been problematic in that it has been impossible to obtain a sufficient difference (margin) in oscillation threshold gain between the principal and subordinate modes, especially where the injected current is small as in the vicinity of the threshold value.

They also present a problem in that since, as has been explained, the diffraction grating of the phase adjustment area is constructed in such a manner that the amount of cumulative phase change is one half of a pitch of the diffraction grating of the uniform pitch areas, there is a limit to the degree of flattening of distribution of electric field intensity in the axial direction of the resonator (the horizontal direction in FIG. 10) which is feasible, so that it is not necessarily possible to achieve stable single-mode oscillation.

SUMMARY OF THE INVENTION

It is an object of the present invention to facilitate stable single-mode oscillation by flattening the distribution of electric field intensity in the direction of the resonator axis, and to provide a distributed-feedback semiconductor laser generator having a more satisfactory difference in between the principal and subsidiary modes.

To this end, the present invention is a distributed-feedback semiconductor laser comprising an active layer which radiates light as a result of the injection of electrons, a light guide layer which is next to this active layer and guides light emitted from the active layer, a plurality of semiconductor layers between which the active layer and light guide layer are interposed, electrodes which permit electrons to be injected from these semiconductor layers into the active layer, a non-reflective coating which is provided on both ends of the active layer in the direction of oscillation, and a diffraction grating which is provided on the light guide layer as means of selecting the oscillatory wavelength of the light.

Furthermore, in the present invention the diffraction grating has a plurality of uniform pitch areas formed with a uniform and equal pitch (cycle, or period), and a varying pitch area interposed between the uniform pitch areas and having a plurality of pitches (cycles, or periods) longer and shorter than those of these uniform pitch areas, the latter serving to select the oscillatory wavelength of the light, where the absolute value of the sum-total of the amount of phase change in the varying pitch area (cumulative amount of phase change) in relation to the phase in the uniform pitch areas is between 3/2 and 11/2 times the pitch of the diffraction grating of the uniform pitch areas.

Because in the distributed-feedback semiconductor laser configured in the above manner the absolute value of the amount of phase change, which is to say the sum-total of the amount of phase change by the diffraction grating of the varying pitch area in relation to the phase of the diffraction grating of the uniform pitch areas is between 3/2 and 11/2 times the pitch of the diffraction grating of the uniform pitch areas, the convergence of electric field intensity on the varying pitch area is alleviated in comparison with the conventional 1/2 times, and the distribution of electric field intensity is flattened. Moreover, the difference in threshold gain between the principal and subordinate modes is more satisfactory than hitherto. Thus, an ample difference in threshold gain can be achieved even below the oscillation threshold value, and stable single-mode oscillation is feasible even at times of high laser output. Moreover, the distribution of optical output characteristics in relation to phase shift position, diffraction grating end phase and end reflectivity tolerance is inhibited, leading to increased yield.

Moreover, changing the pitch of the diffraction grating of the varying pitch area step by step or continuously permits ample suppression of the threshold gain of the subordinate mode, thus making it possible to achieve a satisfactory difference in threshold gain between the principal and subordinate modes even in the vicinity of the oscillation threshold value.

BRIEF DESCRIPTION OF THE DRAWINGS

FIG. 2 is a graph showing the relationship of the pitch to the position of the diffraction grating within the laser element as illustrated in FIG. 1;

FIG. 3 is a graph showing a second example of a diffraction grating as illustrated in FIG. 1;

FIG. 4 is a graph showing a third example of a diffraction grating as illustrated in FIG. 1;

FIG. 9 is a graph showing the relationship of normalized electric field intensity to position within the laser element of the distributed-feedback semiconductor laser illustrated in FIG. 1;

FIG. 10 is a lateral cross-section illustrating the configuration of a conventional distributed-feedback semiconductor laser.

DESCRIPTION OF THE PREFERRED EMBODIMENTS

There now follows a detailed description of the preferred embodiments of the present invention with reference to the drawings.

Figure 1:
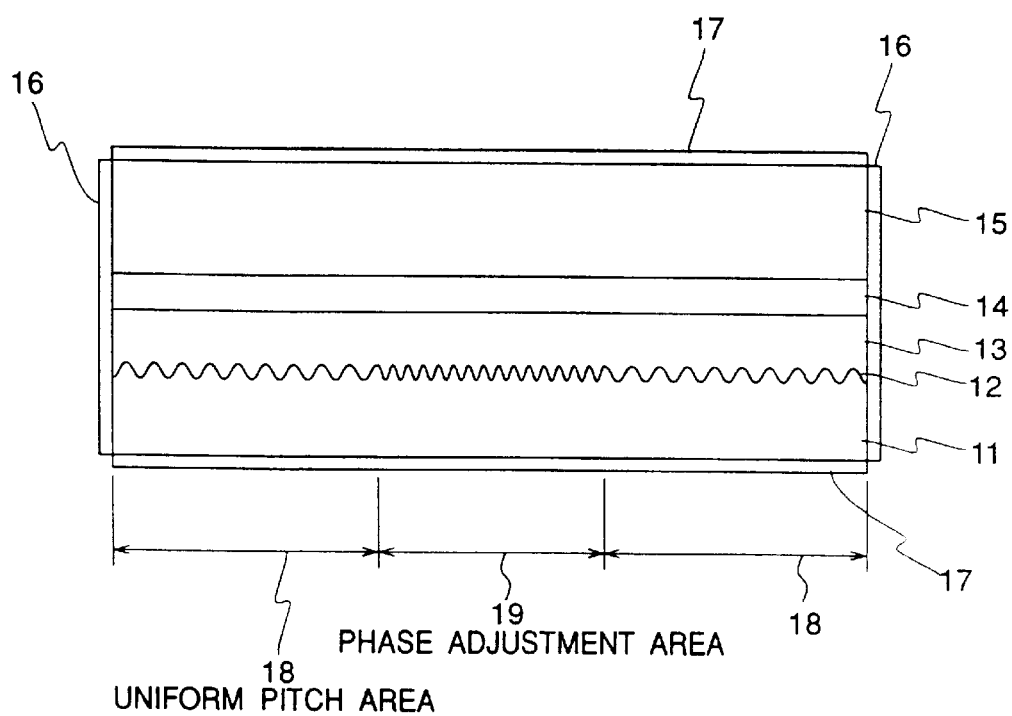
FIG. 1 is a lateral cross-section illustrating the configuration of the distributed-feedback semiconductor laser to which the present invention pertains.
Figure 11:
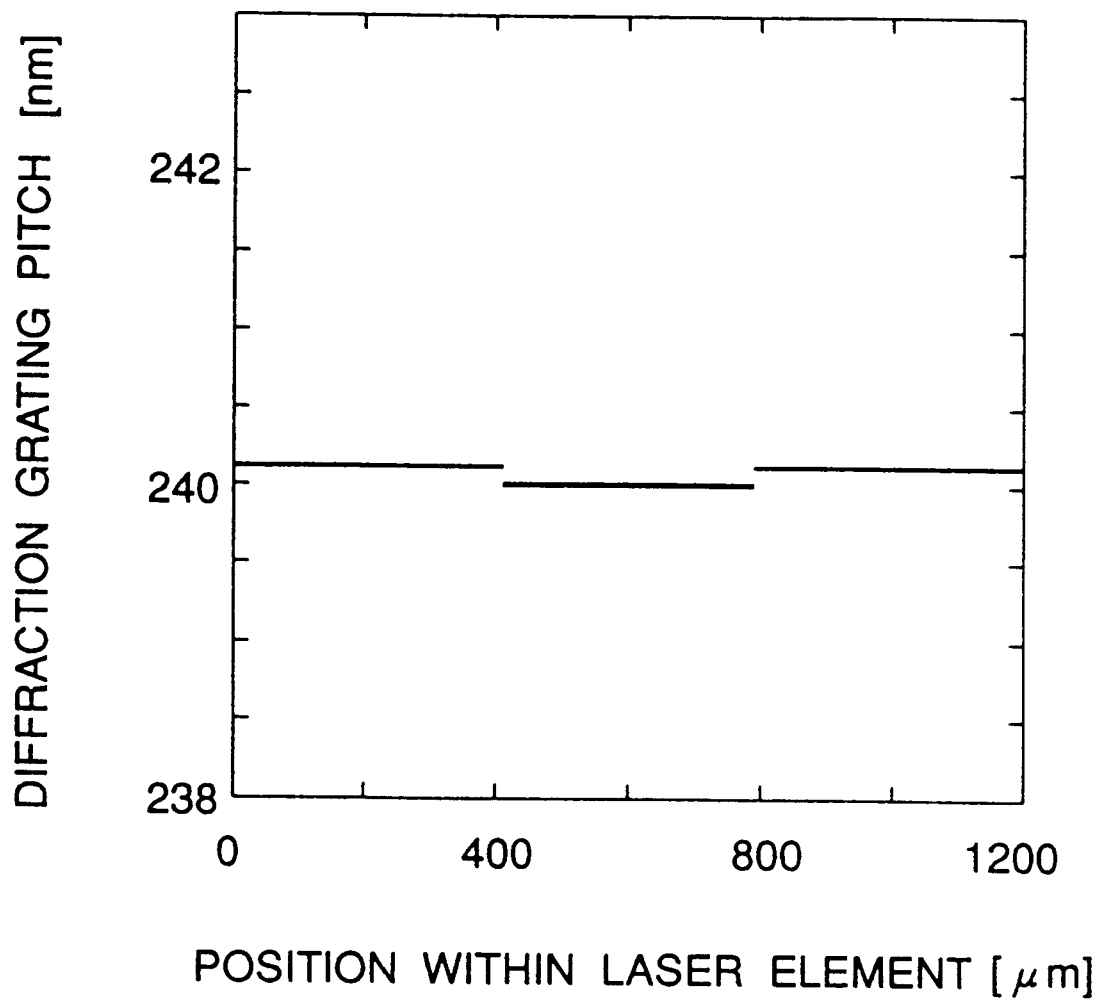
FIG. 11 is a graph showing the relationship of the pitch to the position of the diffraction grating within the laser element as illustrated in FIG. 10.

Referring to FIG. 1, the distributed-feedback semiconductor laser to which the present invention pertains has a semiconductor substrate 1 and a diffraction grating 2, which is formed on the semiconductor substrate 1 for the purpose of selecting the oscillation wavelength. On the semiconductor substrate 1 on which this diffraction grating 2 is formed are also formed by virtue of MOVPE growth an optical guide layer 3, an MQW active layer 4 and a clad layer 5 in that order.

Sandwiching this MQW active layer 4 between the n-type semiconductor substrate 1, which has a large band gap, and the p-type semiconductor clad layer 5, which has a small band gap, allows the formation of a double heterostructure (DH) laser element (resonator). On the surface of the semiconductor substrate 1 and the clad layer 5 are each formed electrodes 7, the purpose of which is to inject electrons from the semiconductor substrate 1 into the MQW active layer 4. To both ends of the laser element is applied an AR coating (non-reflective coating) 6.

As FIG. 1 shows, the diffraction grating 2 is formed with areas of uniform and equal pitch at either end of the laser element (uniform pitch areas 8), while the central area (varying pitch area 9) is formed in such a manner as to change continuously at a shorter pitch than that of the uniform pitch areas 8.

With this same configuration, conventional distributed-feedback semiconductor lasers as illustrated in FIG. 10 have had the diffraction grating of the phase adjustment area constructed in such a manner that the amount of cumulative phase change is one half of the pitch of the diffraction grating of the uniform pitch areas (ie one quarter of the wavelength ($\lambda/4$) in relation to the standing wave of the laser beam within the resonator. Here, the amount of cumulative phase change refers to the sum-total of the amount of phase change induced by the diffraction grating of the phase adjustment area 19 in relation to the phase of the diffraction grating of the uniform pitch areas 18.

In the distributed-feedback semiconductor laser to which the present invention pertains, the diffraction grating of the varying pitch area 9 is constructed in such a manner that the amount of cumulative phase change is greater than one half of the pitch of the diffraction grating of the uniform pitch areas 8. It is therefore possible further to alleviate the convergence of electric field intensity on the varying pitch area 9 in comparison with when the amount of cumulative phase change is only one half of the pitch. Moreover, continuously changing the pitch of the diffraction grating of the varying pitch area 9 permits ample suppression of the threshold gain of the subordinate mode, thus making it possible to achieve a satisfactory difference in threshold gain between the principal and subordinate modes even in the vicinity of the oscillation threshold value.

FIG. 3 illustrates another example of a diffraction grating, showing that the pitch of the varying pitch area 9 may also be changed step by step rather than continuously. In the example shown, the change is effected in five steps. In connection with the non-reflective coating 6, it is best for the varying pitch area illustrated in FIGS. 2 and 3 to be located centrally in the direction of the resonance axis of the laser element. It is fashioned in such a manner that the section with the shortest pitch is in the centre, and the pitch becomes longer either continuously or step by step symmetrically from the centre outwards.

For a distributed-feedback semiconductor laser to oscillate in single mode, the diffraction grating of the varying pitch area 9 is formed in such a way that the amount of cumulative phase change is $\pm(2m-1)/2$ (where m=0, 1, 2, 3 . . . ) in relation to the pitch of the uniform pitch areas 8. In the distributed-feedback semiconductor laser to which the present invention pertains, the diffraction grating of the varying pitch area 9 is formed in such a manner that the amount of cumulative phase change is 3/2 pitch or more in relation to the pitch of the uniform pitch areas 8, thus being greater than 1/2 of the uniform pitch areas as explained above. Furthermore, in order to ensure oscillation on Bragg wavelengths, it is desirable that the amount of cumulative phase change be more precisely $\pm(2n-1) \lambda/4$ (n: natural number) in relation to the standing wave within the resonator.

In FIG. 4, the pitch of the diffraction grating of the varying pitch area 9 is changing continuously towards a longer pitch in relation to that of the diffraction grating of the uniform pitch areas. FIG. 1 illustrates a case where it is changing continuously towards a shorter pitch. On the other hand, it is sufficient that the pitch of the diffraction grating of the varying pitch area 9 be $\pm(2n+1) 2$ (n; natural number) in relation to that of the diffraction grating of the uniform pitch areas, and it may also be allowed to change towards a longer pitch.

Figure 5:
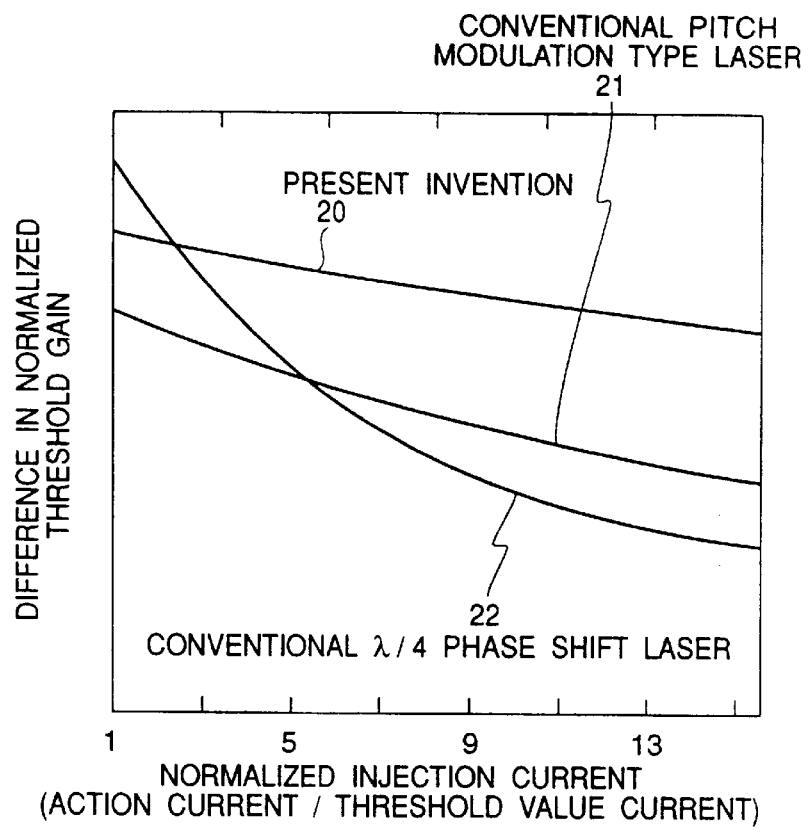
FIG. 5 is a graph showing the relationship of difference in normalized threshold gain to normalized injected current in a distributed-feedback semiconductor laser.
Figure 6:
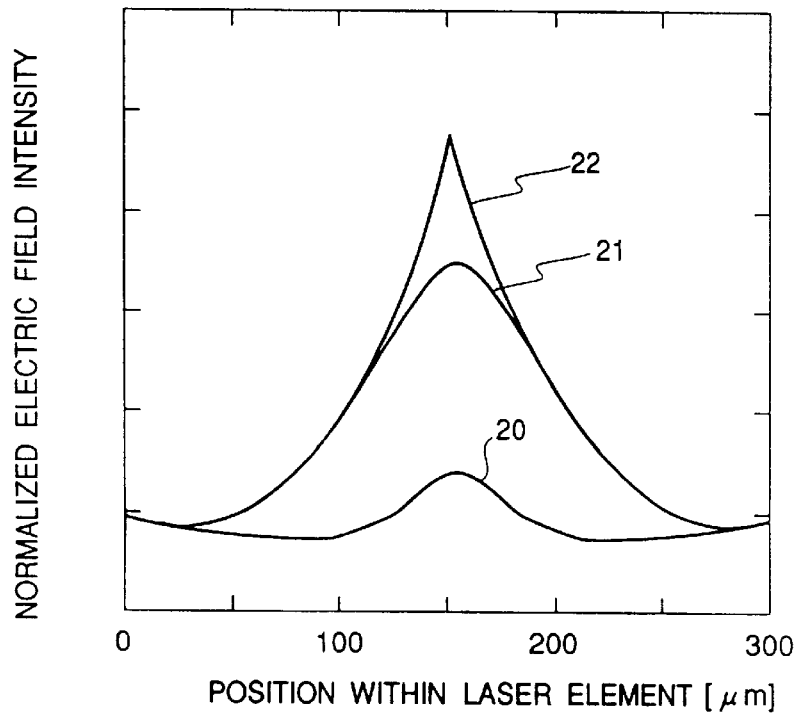
FIG. 6 is a graph showing the relationship of normalized electric field intensity to position within a distributed-feedback semiconductor laser element.

FIG. 5 is a graph showing the relationship of difference in normalized threshold gain to normalized injected current in a distributed-feedback semiconductor laser, while FIG. 6 shows the relationship of normalized electric field intensity to position within a distributed-feedback semiconductor laser element. FIGS. 5 and 6 show the characteristics of conventional $\lambda/4$ phase shift lasers 22, conventional pitch modulation lasers 21, and the distributed-feedback semiconductor lasers to which the present: invention 20 as illustrated in FIGS. 1 and 2 pertains.

As may be seen from FIG. 5, even where the injected current is small, the distributed-feedback semiconductor laser 20 to which the present invention pertains makes it possible to achieve a difference in normalized threshold gain equivalent to that of conventional $\lambda/4$ phase shift lasers 22. Moreover, FIG. 6 shows that the present invention is characterised by a flatter distribution of normalized electric field intensity within the laser element than is the case with the conventional $\lambda/4$ phase shift 22 and pitch modulation lasers 21. This means that stable oscillation can be achieved in single mode even with increased current injection and laser beam output.

Figure 7:
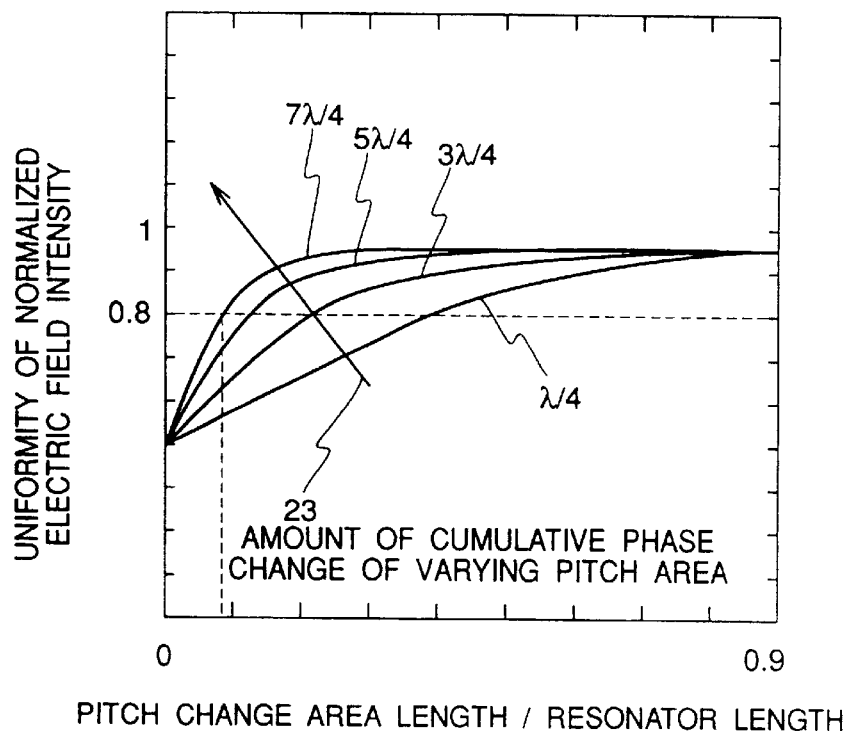
FIG. 7 is a graph showing the relationship of uniformity of normalized electric field intensity to ratio of cyclic change area and resonator length in the distributed-feedback semiconductor laser illustrated in FIG. 1.
Figure 8:
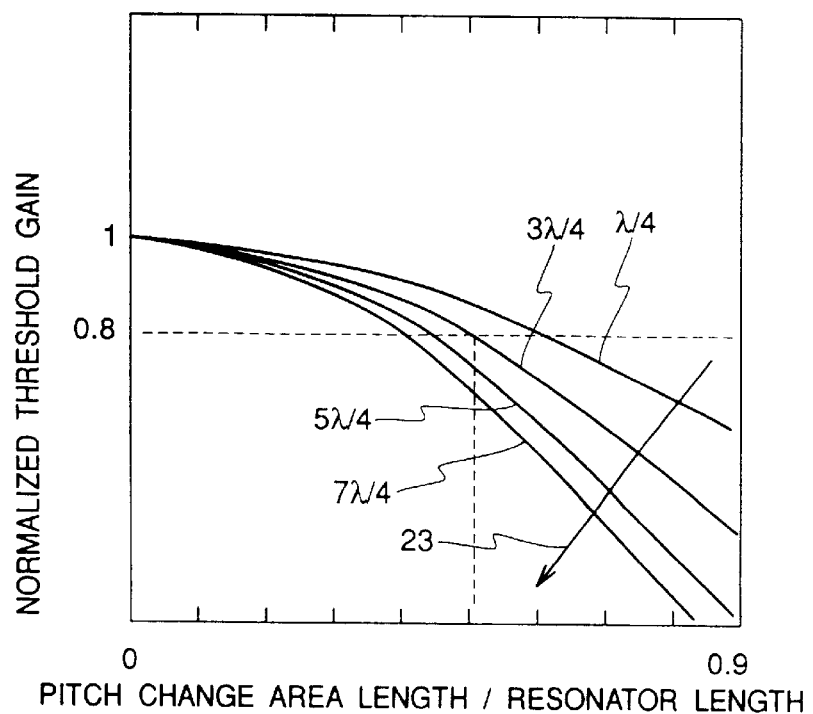
FIG. 8 is a graph showing the relationship of difference in normalized threshold gain to ratio of cyclic change area and resonator length in the distributed-feedback semiconductor laser illustrated in FIG. 1.

FIG. 7 is a graph showing the relationship of uniformity of normalized electric field intensity to ratio of cyclic change area and resonator length in the distributed-feedback semiconductor laser illustrated in FIG. 1, while FIG. 8 is a graph showing the relationship of difference in normalized threshold gain to ratio of cyclic change area and resonator length in the distributed-feedback semiconductor laser illustrated in FIG. 1. Uniformity of normalized electric field intensity is the ratio of minimum and maximum normalized electric field intensity values.

As is shown in FIG. 7, increasing the amount of cumulative phase change in relation to the standing wave within the resonator from $\lambda/4$ (one quarter of a wavelength) to 3 $\lambda/4$, 5 $\lambda/4$ . . . permits a flatter distribution of electric field intensity in the short varying pitch area 9. Moreover, it will be clear from FIG. 8 that the shorter the varying pitch area 9, the greater the difference in normalized threshold gain which it is possible to achieve. Here, continuously changing the pitch of the diffraction grating of the varying pitch area 9 ensures that there is scarcely any deterioration in the difference in normalized threshold gain even with increased amounts of cumulative phase change.

A suitable amount 23 of cumulative phase change whereby the distribution of electric field intensity is flattened to an acceptable extent and an satisfactory difference in threshold gain is achieved is $\pm(2n+1) \lambda$ ($1 \leq n \leq 5$).

A particularly suitable amount 23 of cumulative phase change for the distribution of electric field intensity to be flattened to an acceptable extent and an satisfactory difference in threshold gain to be achieved is between 3 $\lambda/4$ and 7 $\lambda/4$.

Moreover, with a view to ensuring a normalized electric field intensity of at least 0.8 in order to achieve stable oscillation characteristics even during high output, it is preferable, as will be clear from FIG. 7, for the length of the varying pitch area 9 not to be less than $1/10$ (for the ratio to be 0.1) in relation to the length of the resonator.

Furthermore, with a view to ensuring a normalized threshold gain of at least 0.8 in order to avoid oscillation in subsidiary more during high-speed direct modulation, it is preferable, as will be clear from FIG. 8, for the length of the varying pitch area 9 not to be more than $5/10$ (for the ratio to be 0.5) in relation to the length of the resonator.

FIG. 9 is a graph showing the relationship of normalized electric field intensity to position within the laser element of the distributed-feedback semiconductor laser illustrated in FIG. 1.

As FIG. 9 shows, increasing the amount 23 of cumulative phase change of the varying pitch area 9 in excess of $\lambda/4$ causes the distribution of electric field intensity to flatten. However, it will also be seen that where the amount 23 of cumulative phase change of the varying pitch area is relatively great (as λ/4, 3 λ/4 and 5 λ/4) in comparison with the uniform pitch area 8, it increases with the injection of electric current. Thus, the carrier density of the phase change area 9 decreases, while the refractivity of the MQW active layer 4 increases in the varying pitch area thanks to the plasma effect. In order to prevent the stability of single-mode oscillation from deteriorating as a result of this influence, the best solution is to shorten the pitch of the diffraction grating of the varying pitch area 9 and make it difficult for the oscillation wavelength to diverge from the Bragg wavelength.

Conversely, the pitch of the diffraction grating of the varying pitch area 9 may be increased where changes in the refractivity of the MQW active layer 4 increase in the uniform pitch area, as where the amount of cumulative phase change is 7 λ/4.

By adopting a configuration as described above it is possible to ensure that the difference in threshold gain between principal and subsidiary modes is sufficiently great, and that the distribution of electric field intensity in the direction of the resonator axis is flattened. Thus, an ample difference in threshold gain can be achieved even below the oscillation threshold value, and stable single-mode oscillation is feasible even at times of high laser output. Moreover, the distribution of optical output characteristics in relation to phase shift position, diffraction grating end phase and end reflectivity tolerance is inhibited, leading to increased yield.

There follows a description of the method of production of the distributed-feedback semiconductor laser to which the present invention pertains.

A distributed-feedback semiconductor laser configured as illustrated in FIG. 1 is created first of all by using the electron beam exposure method to transfer a resist pattern on to a resist-coated n-InP semiconductor substrate 1, thus forming a diffraction grating pattern.

As FIG. 2 shows, the diffraction grating has at either end of the element (in the uniform pitch areas 8) an equal and uniform pitch, while in the centre there is an area (varying pitch area 9) where the pitch is continuously increased or decreased in relation to the uniform pitch areas 8. Here, the pitch of the diffraction grating of the varying pitch area 9, including the diffraction grating of the uniform pitch areas 8, is continuously changing.

On to the semiconductor substrate 1, on which the diffraction grating 2 is formed, are also formed by virtue of MOVPE growth an optical guide layer 3, an MQW active layer 4 and a clad layer 5 in that order. From a double heterostructure wafer formed in this manner is fashioned a stripe-shaped resonator by means of etching. Prescribed crystals are buried in order to prevent the electric current from leaking, forming in this manner a DC-PBH (double-channel planar-buried heterostructure) laser element.

Next, electrodes 7 for the purpose of injecting electric current into the MQW active layer 4 are formed on the surfaces of the semiconductor substrate 1 and the clad layer 5, and an AR coating is applied to both ends of the laser element. It is configured in such a manner that the amount of cumulative phase change in the varying pitch area 9 is 5 λ/4, the length of the laser element is 600 μm, and the coupling coefficient κ is 70 cm$^{-1}$.

Assessment of a distributed-feedback semiconductor laser created in this manner yielded good characteristics, namely an oscillation threshold value of 10 mA, a slope efficiency of 0.3 W/A, and a side mode suppression ratio (SMSR) of 50 dB. With this distributed-feedback semiconductor laser not only was it possible to achieve a difference in threshold gain equivalent to that of a conventional λ/4 phase shift laser even below the threshold value, but single-mode oscillation was stable up to high laser output, and a maximum output was attained which was approximately twice that of a conventional λ/4 phase shift laser.

In the above description only one varying pitch area 9 has been used, but it is also possible to create two or more in order to control the distribution of electric field intensity within the laser element more precisely.

The invention may be embodied in other specific forms without departing from the spirit or essential characteristic thereof. The present embodiments is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A distributed-feedback semiconductor laser comprising:

an active layer which radiates light as a result of the injection of electrons;

a light guide layer which is next to this active layer and guides light emitted from the active layer;

a plurality of semiconductor layers between which the active layer and light guide layer are interposed;

electrodes which permit electrons to be injected from these semiconductor layers into the active layer;

a non-reflective coating which is provided on both ends of the active layer in the direction of oscillation; and a diffraction grating which is provided on the light guide layer for selecting the oscillatory wavelength of the light, the diffraction grating having:

a plurality of uniform pitch areas formed with a uniform and equal pitch; and a varying pitch area interposed between the uniform pitch areas and having a plurality of pitches longer and shorter than those of these uniform pitch areas, wherein the absolute value of the sum-total of the amount of phase change in the varying pitch area (cumulative amount of phase change) in relation to the phase in the uniform pitch areas is between 3/2 and 11/2 times the pitch of the diffraction grating of the uniform pitch areas.

2. The distributed-feedback semiconductor laser according to claim 1, wherein the amount of cumulative phase change ±(2n+1)/2 times the pitch of the diffraction grating of the uniform pitch areas, where n is a natural number between 1 and 5.

3. The distributed-feedback semiconductor laser according to claim 1, wherein the diffraction grating assumes the form of an unevenness created between the semiconductor and light guide layers.

4. The distributed-feedback semiconductor laser according to claim 1, wherein the varying pitch area is located in the centre of the light guide layer.

5. The distributed-feedback semiconductor laser according to claim 1, wherein the longest or shortest section of the varying pitch area is located in the centre of the light guide layer.

6. The distributed-feedback semiconductor laser according to claim 1, wherein changes in the pitch of the varying pitch area occur from the centre of the pitch peak continuously as far as the pitch of the uniform pitch area.

7. The distributed-feedback semiconductor laser according to claim 2, wherein the length of the varying pitch area is between 1/10 and 1/2 that of the light guide layer.

8. A distributed-feedback semiconductor laser comprising:

an active layer which radiates light as a result of the injection of electrons;

a light guide layer which is next to this active layer and guides light emitted from the active layer;

a plurality of semiconductor layers between which the active layer and light guide layer are interposed;

electrodes which permit electrons to be injected from these semiconductor layers into the active layer;

a non-reflective coating which is provided on both ends of the active layer in the direction of oscillation; and a diffraction grating which is provided on the light guide layer for selecting the oscillatory wavelength of the light, the diffraction grating having:

a plurality of uniform pitch areas formed with a uniform and equal pitch; and a varying pitch area interposed between the uniform pitch areas and having symmetrically from the centre of the pitch peak a plurality of pitches longer and shorter than those of these uniform pitch areas.

9. The distributed-feedback semiconductor laser according to claim 8, wherein changes in the pitch of the varying pitch area occur from the centre of the pitch peak continuously as far as the pitch of the uniform pitch area.

10. The distributed-feedback semiconductor laser according to claim 8, wherein the length of the varying pitch area is between 1/10 and 1/2 that of the light guide layer.

11. A distributed-feedback semiconductor laser comprising:

an MQW active layer which radiates light as a result of the injection of electrons;

an n-type semiconductor substrate with a large band gap;

a p-type semiconductor clad layer;

a light guide layer which is next to the semiconductor substrate or clad layer and guides light emitted from the active layer;

electrodes located on the semiconductor substrate and clad layer;

a non-reflective coating which is provided on both ends of the active layer in the direction of oscillation, and a diffraction grating which is provided on the light guide layer for selecting the oscillatory wavelength of the light, the diffraction grating having:

a plurality of uniform pitch areas formed with a uniform and equal pitch; and a varying pitch area interposed between the uniform pitch areas and having a plurality of pitches longer and shorter than those of these uniform pitch areas symmetrically from the centre of the pitch peak, wherein the absolute value of the cumulative amount of phase change, which is to say the sum-total of the amount of phase change, in the varying pitch area in relation to the phase in the uniform pitch areas is between 3/2 and 11/2 times the pitch of the diffraction grating of the uniform pitch areas, and wherein the amount of cumulative phase change is $\pm(2n+1)/2$ times the pitch of the diffraction grating of the uniform pitch areas, where n is a natural number between 1 and 5.

12. The distributed-feedback semiconductor laser according to claim 11, wherein the amount of cumulative phase change is $5\lambda/4$, and the coupling coefficient is $70\ cm^{-1}$.

13. The distributed-feedback semiconductor laser according to claim 11, wherein the length of the semiconductor substrate is 600 micrometers, the pitch of the uniform pitch area is 241.5 nanometers, and the pitch which forms the peak of the varying pitch area is 240.5 nanometers.

14. A distributed-feedback semiconductor laser comprising:

active means which radiates light as a result of the injection of electrons; and light guide means which guides light to an interface located on a diffraction grating, being of a length for the purpose of rendering the normalized electric field intensity uniform wavelength of the light uniform, and suppressing threshold gain of the subordinate mode.

* * * * *